(12) United States Patent
Bliss et al.

(10) Patent No.: US 8,661,309 B2
(45) Date of Patent: Feb. 25, 2014

(54) SYSTEMS FOR HIGH-SPEED BACKPLANE APPLICATIONS USING PRE-CODING

(75) Inventors: William Bliss, Thornton, CO (US); Vasudevan Parthasarathy, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 360 days.

(21) Appl. No.: 13/014,519

(22) Filed: Jan. 26, 2011

(65) Prior Publication Data

US 2011/0191656 A1    Aug. 4, 2011

Related U.S. Application Data

(60) Provisional application No. 61/299,791, filed on Jan. 29, 2010.

(51) Int. Cl.
*H03M 13/00* (2006.01)

(52) U.S. Cl.
USPC ........................................................ 714/752

(58) Field of Classification Search
USPC .................... 714/751–752, 784; 375/260–261
See application file for complete search history.

(56) References Cited

U.S. PATENT DOCUMENTS

| | | | |
|---|---|---|---|
| 6,101,223 A * | 8/2000 | Betts .............................. | 375/261 |
| 7,082,253 B2 | 7/2006 | Dominic et al. | |
| 7,113,667 B2 | 9/2006 | Welch et al. | |
| 7,430,212 B2 * | 9/2008 | Stanley et al. ................ | 370/420 |
| 7,573,871 B2 | 8/2009 | Lahav et al. | |
| 7,693,240 B2 | 4/2010 | Mezer et al. | |
| 7,805,657 B2 | 9/2010 | Kappler et al. | |
| 7,823,041 B2 | 10/2010 | Mezer et al. | |
| 7,860,400 B2 | 12/2010 | Cole | |
| 7,873,892 B2 | 1/2011 | Ganga et al. | |
| 8,151,165 B2 | 4/2012 | Belogolovy et al. | |
| 8,370,701 B2 * | 2/2013 | Diab et al. .................... | 714/753 |
| 2004/0001540 A1 | 1/2004 | Jones | |
| 2006/0256875 A1 | 11/2006 | McClellan | |
| 2007/0157060 A1 | 7/2007 | Ganga et al. | |
| 2011/0191657 A1 | 8/2011 | Bliss et al. | |

FOREIGN PATENT DOCUMENTS

| | | |
|---|---|---|
| EP | 1 770 912 A1 | 4/2007 |
| EP | 1 903 733 A2 | 3/2008 |

OTHER PUBLICATIONS

European Search Report for EP Patent Application No. 11000714.3, European Patent Office, Munich, Germany, mailed on Oct. 17, 2013.

(Continued)

*Primary Examiner* — Shelly A Chase

(74) *Attorney, Agent, or Firm* — Sterne, Kessler, Goldstein & Fox P.L.L.C.

(57) ABSTRACT

In conventional Backplane Ethernet systems, data is transmitted over two pairs of copper traces in one direction using a PAM-2 scheme and a baud rate of 10.3125 GHz, giving an effective bit rate of 10.3125 Gbps. The rate at which data can be transmitted in Backplane Ethernet systems, while still being reliably received, is typically limited by ISI caused by the dispersive nature of the copper traces, frequency dependent transmission losses caused primarily by skin effect and dielectric loss of the copper traces, and cross-talk from adjacent communication lines. The present invention is directed to systems for overcoming these and other signal impairments to achieve speeds up to, and beyond, twice the conventional 10 Gbps limit associated with Backplane Ethernet systems.

18 Claims, 8 Drawing Sheets

(56) References Cited

OTHER PUBLICATIONS

Yongru Gu et al., "Pipelining Tomlinson-Harashima Precoders," Conference Proceedings/IEEE International Symposium on Circuits and Systems (ISCAS), May 23-26, 2005, International Conference Center, Kobe, Japan, IEEE Service Center, Piscataway, New Jersey, May 23, 2005, pp. 408-411.

* cited by examiner

SYSTEMS FOR HIGH-SPEED BACKPLANE APPLICATIONS USING PRE-CODING

CROSS REFERENCE TO RELATED APPLICATIONS

This application claims the benefit of U.S. Provisional Patent Application No. 61/299,791, filed Jan. 29, 2010, entitled "High Data Rate Ethernet for Backplane Applications," which is incorporated herein by reference in its entirety.

FIELD OF THE INVENTION

This application relates generally to high-speed communications and, more particularly, to systems for high-speed communications over backplanes.

BACKGROUND

Communication systems are designed to transfer information between two devices over a medium in the presence of disturbing influences. Intersymbol interference (ISI) is one well-known disturbing influence in which transmitted symbols become elongated and interfere with adjacently transmitted symbols. This spreading or "smearing" of symbols is generally caused by the dispersive nature of common communication mediums. Because ISI has the same effect as noise, communication is made less reliable.

One of the most basic solutions for mitigating the effects of ISI is slowing down the speed at which symbols are transmitted over a medium. More specifically, the transmission speed can be slowed down such that a symbol is only transmitted after allowing previously transmitted symbol pulses to dissipate. The time it takes for a symbol pulse to dissipate is called delay spread, whereas the original time of the symbol pulse (including any time before the next symbol pulse is transmitted) is called the symbol time. No ISI will occur if the delay spread is less than or equal to the symbol time.

Although slowing down the symbol rate can eliminate the effects of ISI, it is generally an unacceptable solution for many of today's communication applications. In fact, many of today's communication applications require speeds in the multi-gigabit per second range. At such high speeds, ISI can completely overwhelm a signal transmitted over a few inches of printed circuit board trace, a few feet of copper cable, or a few tens of meters of multimode optical fiber.

Backplane Ethernet is one type of communication application that suffers from ISI. Backplane Ethernet has been standardized, at least to some degree, under the IEEE 802.3ap standard and is commonly used in devices such as routers, switches, and blade servers. The IEEE 802.3ap standard specifically defines operation characteristics for 10 Gbps Backplane Ethernet in configurations that communicate data differentially over two pairs of copper traces on printed circuit boards. Data is transmitted over each pair of copper traces in one direction using a one-bit, pulse amplitude modulation (PAM) scheme and a baud rate of 10.3125 GHz.

Although the conventional 10 Gbps speed limit already presents significant signal impairment challenges from ISI and other noise sources, providers of Backplane Ethernet applications are pushing designers to achieve speeds up to, and beyond, twice the conventional 10 Gbps limit. However, at those speeds, traditional, cost effective transceiver designs for Backplane Ethernet applications cannot reliably transmit and receive information over copper traces on a printed circuit board due to ISI and other noise sources.

Therefore, what is needed is a cost effective system for supporting backplane applications having speeds up to, and beyond, twice the conventional 10 Gbps limit.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

1. EXAMPLE BACKPLANE OPERATING ENVIRONMENT

Figure 1:
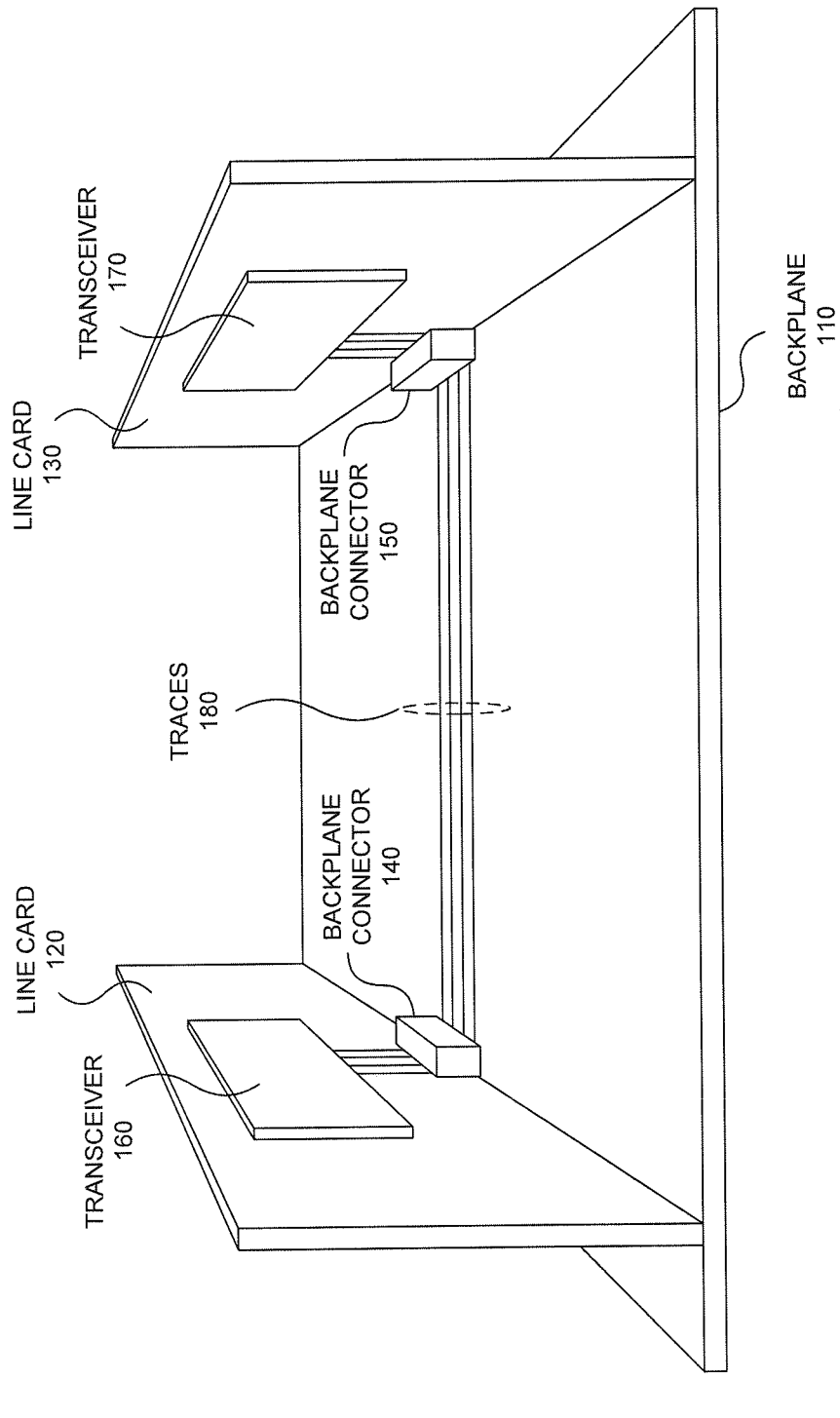
FIG. 1 illustrates an exemplary backplane operating environment, according to embodiments of the present invention.

FIG. 1 illustrates an example Backplane Ethernet system 100, according to embodiments of the present invention. As shown in FIG. 1, example Backplane Ethernet system 100 includes a backplane 110 and two line cards (or daughter cards) 120 and 130. Line cards 120 and 130 are respectively coupled to backplane 110 by connectors 140 and 150 (e.g., HM-Zd connectors) disposed on the surface of backplane 110, and each includes a respective transceiver 160 and 170.

In operation, transceivers 160 and 170 are configured to send data to, and receive data from, each other. The data communicated between the two transceivers is sent over two pairs of traces 180 (e.g., copper traces) disposed on the surface of backplane 110: a first pair of traces is used to communicate data differentially to transceiver 170 from transceiver 160, and a second pair of traces is used to communicate data differentially to transceiver 160 from transceiver 170. In one embodiment, the data transmitted between the two transceivers is modulated using pulse amplitude modulation (PAM).

In conventional Backplane Ethernet systems, data is specifically transmitted over each pair of traces in one direction using a one-bit, PAM scheme and a baud rate of 10.3125 GHz, giving an effective bit rate of 10.3125 Gbps. The rate at which data can be transmitted in Backplane Ethernet systems, while still being reliably received, is typically limited by ISI caused by the dispersive nature of the copper traces, frequency dependent transmission losses caused primarily by skin effect and dielectric loss of the copper traces, and cross-talk from adjacent communication lines. The present invention is directed to systems for overcoming these and other signal impairments to achieve speeds up to, and beyond, twice the conventional 10 Gbps limit associated with Backplane Ethernet systems.

It should be noted, however, that example Backplane Ethernet system 100 provides only one example system in which features of the present invention can be implemented. For example, features of the present invention can be implemented in communication systems that transmit and receive data formatted in accordance with signaling standards other than Ethernet. In addition, features of the present invention can be implemented in communication systems that transmit and receive data over mediums other than copper traces disposed on a printed circuit board. For example, other possible transmission mediums include coaxial cable, optical fiber (both single mode and multimode), twisted pair, radio, and satellite, to name a few. In addition, digital modulation schemes other than PAM can be used, including quadrature amplitude modulation (QAM) and quadrature phase shift keying (QPSK), for example. Although these and other possible systems exist for implementing features of the present invention, the various features of the present invention will be described below in the particular context of Backplane Ethernet system 100.

2. TRANSMITTER

Figure 2:
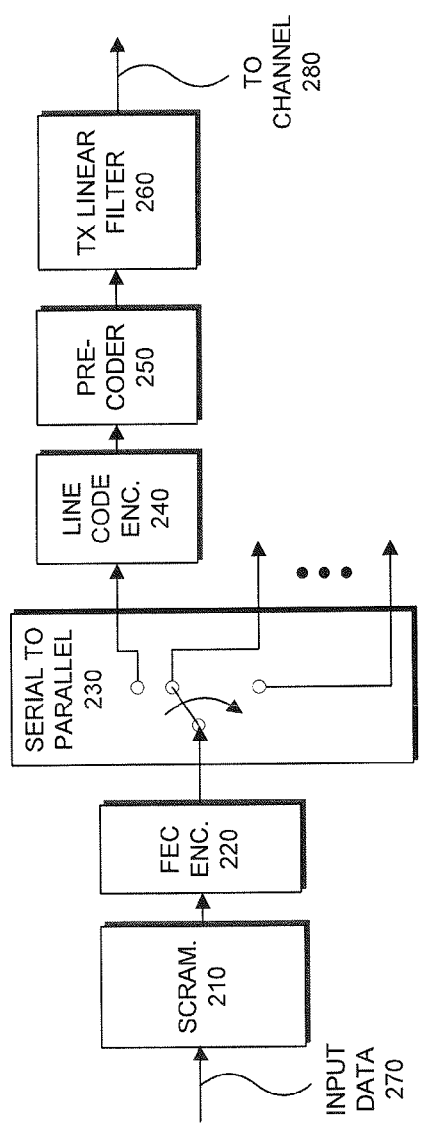
FIG. 2 illustrates an exemplary transmitter, according to embodiments of the present invention.

FIG. 2 illustrates an example transmitter 200, according to embodiments of the present invention. As illustrated in FIG. 2, transmitter 200 includes a scrambler 210, a forward error correction (FEC) encoder 220, a serial-to-parallel module 230, a line code encoder 240, a pre-coder 250, and a TX linear filter (also referred to as a pre-emphasis filter) 260.

In one embodiment, transmitter 200 is implemented within a line card transceiver and is configured to transmit data over one or more traces on a printed circuit board in a Backplane Ethernet system, such as Backplane Ethernet system 100. More particularly, transmitter 200 is configured to transmit data over one or more traces on a printed circuit board in a Backplane Ethernet system at speeds beyond the conventional Backplane Ethernet data rate of 10.3125 Gbps, as specified by the IEEE 802.3ap standard, by using a PAM scheme with an order greater than the typically employed PAM-2 scheme. For example, PAM-4 is a two-bit modulation scheme that maps two-bits of data to one of four possible signal levels per transmitted symbol. Thus, using PAM-4 at the conventional 10.3125 GHz baud rate provides a data rate of approximately 20.625 Gbps.

Transmitting data using a higher order modulation scheme, such as PAM-4, is not without costs, however. In general, a receiver will require a higher signal-to-noise ratio (SNR) to reliably decode the data because of the higher-order modulation. In other words, although increasing the number of bits per symbol leads to a correspondingly higher data rate, the symbols making up the constellation of the modulation scheme must be packed closer together and are therefore more susceptible to noise (assuming the mean energy of the constellation remains constant).

For example, in PAM-4, the constellation comprises four points on the real line that are typically uniformly spaced. PAM-2, on the other hand, comprises only two points on the real line that are typically uniformly spaced. Thus, there is greater distance between the PAM-2 constellation points then the PAM-4 constellation points (again, this assumes the mean energy of the constellation remains constant) and therefore a greater margin for noise.

Because of the reduced distance between points in PAM-4 and other higher-order PAM schemes, transmitted symbols are now more vulnerable to ISI caused by the dispersive nature of the traces, frequency dependent transmission losses caused primarily by skin effect and dielectric loss of the traces, and cross-talk from adjacent communication lines. Therefore, transmitter 200 includes a novel architecture to overcome these signal impairments to allow data to be transmitted over the channel using PAM-4 and other higher-order modulation schemes at, and above, the conventional 10.3125 GHz baud rate associated with Backplane Ethernet.

In operation, transmitter 200 receives an input data stream at input 270 and manipulates the input data stream to properly format an output data stream for transmission over the channel at output 280. The input data stream can include voice, video, or any other application or program specific data. The input data stream is first received and processed by scrambler 210. Scrambler 210 is configured to eliminate long sequences of digital '0' or '1' values in the input data stream. Eliminating long sequences of digital '0' or '1' values facilitates the work performed by timing recovery and adaptive circuits at the receiver. In one embodiment, scrambler 210 includes a linear feedback shift register (LFSR) and provides a scrambled output data stream as a linear function of the input data stream and a previous state stored in its shift register. In another embodiment, scrambler 210 is implemented in accordance with the 64/66 encoder discussed in the IEEE 802.3ap standard.

After the input data stream has been scrambled by scrambler 210, the scrambled data stream is received and processed by FEC encoder 220. In an embodiment, FEC encoder 220 is used to provide a coding gain that at least partially makes up for the higher SNR requirements imposed by data transmission using the higher order modulation scheme. Coding gain is defined as the effective difference in SNR levels between an uncoded system and a coded system. FEC provides a coding gain by introducing redundancy into the data to be transmitted to allow for detection and recovery of transmission errors.

Several specific FEC schemes can used to encode the scrambled data stream, including, for example, Trellis Coded Modulation (TCM), Low Density Parity Check (LDPC) codes, Turbo Codes, BCH, and Reed-Solomon (RS).

In an embodiment, FEC is specifically added to the scrambled data stream using RS coding. The RS encoding technique appends to each block of k m-ary data symbols, 2t redundancy symbols to create an encoded message block (where t represents the designed symbol error correcting capacity of the code). These 2t symbols, or elements, are selected from the Galois Field to be the roots of the implemented code generator polynomial. There are a total of n=k+2t symbols in an RS encoded message block. The 2t redundant symbols can be used by an RS decoder implemented at a receiver to correct for up to t errors that occur during transmission of the block of k data symbols. In another instance, 2t+1 redundancy symbols are created and appended to each block of k m-ary data symbols, which guarantees that an RS decoder implemented at a receiver can correct all patterns of up to t errors while always detecting and not mis-correcting all patterns of t+1 errors.

In an embodiment, the conventional 10.3125 GHz baud rate used in backplane Ethernet can be increased to compensate for the extra 2t redundant symbols transmitted per encoded message block. For example, the conventional 10.3125 GHz baud rate can be increased by 5% to compensate for 5% more additional data being transmitted due to the 2t redundant symbols. In a further embodiment, the conventional 10.3125 GHz baud rate, which is typically generated using a 156.25 MHz clock, is increased by multiples of 156.25 MHz to provide compensation for the extra 2t redundant symbols. In yet another embodiment, the 1-bit in every 65-bit Ethernet frame typically used by the Ethernet standard to employ an error correction code, referred to as a Fire code, can be robbed to further compensate for the extra 2t redundant symbols transmitted per encoded message block. Specifically, robbing this single bit for every 65-bit Ethernet frame can provide about 1.5% additional transmission room for the extra 2t redundant symbols. In other embodiments, the conventional 10.3125 GHz baud rate is increased by multiples of 62.5 MHz, 78.125 MHz, or 125 MHz to provide compensation for the extra 2t redundant symbols.

The stream of scrambled data and redundant symbols added by FEC encoder 220 are subsequently feed to serial-to-parallel module 230. In general, serial-to-parallel module 230 is optionally included within transmitter 200 when transmitter 200 transmits data over two or more traces to a receiving entity (i.e., when transmitter 200 transmits the input data stream received at input 270 over two or more parallel streams to a receiving entity). Parallel-to-serial module 230 is configured to de-serialize the FEC encoded data stream and place the data on two or more parallel data streams for further processing prior to being sent over parallel channels. It should be noted that, for clarity sake, only one set of processing blocks are shown in FIG. 2 following serial-to-parallel module 230 for a single parallel data stream.

In one embodiment, FEC encoder 220 is positioned prior to serial-to-parallel module 230 in the transmitter chain as shown in FIG. 2 such that one or more of the redundant symbols generated by FEC encoder 220 is produced based on data to be sent over two or more of the parallel data streams. In general, FEC encoding works better when the redundant symbols are generated over larger blocks of data. However, as the size of the data blocks increase, system latency is increased because the receiver has to wait for the entire block of data and redundant symbol to be received before any error correcting/checking can occur. Thus, by generating a redundant symbol based on data to be sent over two or more of the parallel data streams, system latency can be reduced for a symbol generated over the same amount of data sent over a single one of the parallel data streams.

In another embodiment, FEC encoder 220 is positioned after serial-to-parallel module 230 in the transmitter chain. In this instance, a separate FEC encoder 220 is used for each parallel data stream output by serial-to-parallel module 230.

Continuing with the description of the transmitter chain illustrated in FIG. 2, after being de-serialized by serial-to-parallel module 230, each parallel data stream undergoes further processing prior to being sent over the physical channel to a receiving entity. FIG. 2 specifically illustrates the remaining processing blocks for a single one of the parallel data streams output by serial-to-parallel module 230. The parallel data stream is initially received and processed by line code encoder 240. Line code encoder 240 is configured to put the parallel data stream into a form suitable for transmission over the physical channel. This process is often referred to as modulation. In an embodiment, line code encoder 240 is configured to modulate the bits of the parallel data stream in accordance with a PAM scheme, as discussed above, having an order greater than two. For example, and in one embodiment, line code encoder 240 is configured to modulate the bits of the received parallel data stream using PAM-4. However, any reasonable PAM modulation scheme can be used, including PAM-2, PAM-6, and PAM-8, to name a few. In another embodiment, line code encoder 240 is configured to modulate the bits of the received parallel data stream using a complex modulation scheme, such as QAM or QPSK having any reasonable order.

Figure 4:
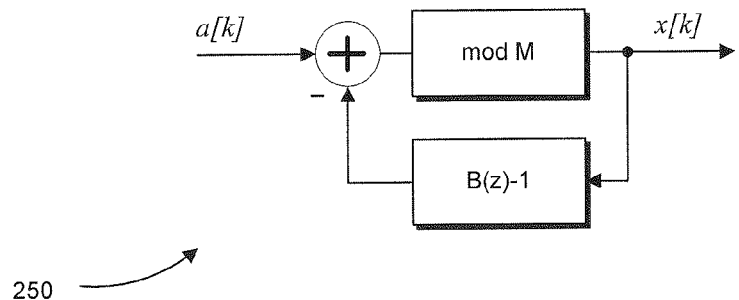
FIG. 4 illustrates a precoder encoder, according to embodiments of the present invention.

After being modulated, the data stream is passed from line code encoder 240 to pre-coder 250. In general, pre-coder 250 uses modulo arithmetic to achieve both pre-equalization and to limit transmit power. A basic implementation of pre-coder 250, in accordance with embodiments of the present invention, is illustrated in FIG. 4. The original symbol sequence $\{a[k]\}$, which is chosen from the constellation of the PAM-M modulation scheme used, is pre-coded to generate the pre-coded data sequence $\{x[k]\}$. In operation, pre-coder 250 performs inverse channel filtering using a feedback filter defined by [B(z)−1] and the modulo operation denoted by mod M. The modulo operation is performed in such a way that the output of pre-coder 250 is limited to be within the interval [0, M−1]. Without loss of generality, let PAM-M be defined as the integers [0, 1, . . . , M−1]. The output of the pre-coder 250 is still 'PAM-M' for all cases of interest, where the coefficients of B(z) are integers. In general, if the result of the summation of the PAM-M signal and the feedback value is greater than or equal to M, some integer multiple of M is subtracted so that the result is less than M. On the other hand, if the result of the summation is less than 0, some integer multiple of M is added so that the result is greater than or equal to 0.

Because the feedforward path of pre-coder 250 uses a nonlinear modulo M device to limit the dynamic range of the output of pre-coder 250 (which otherwise could be unlimited), the output data sequence produced by pre-coder 250 is better analyzed using the linearized model illustrated in FIG.

Figure 5:
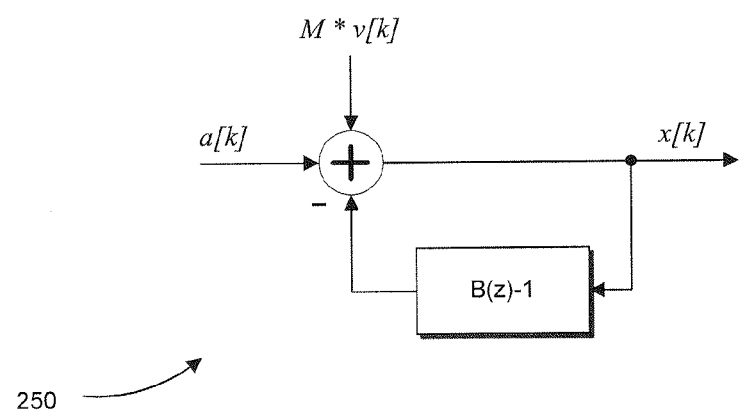
FIG. 5 illustrates a linearized description of the precoder encoder illustrated in FIG. 4, according to embodiments of the present invention.

5. From FIG. 5, it can be seen that the output data sequence of pre-coder 250 in the z-domain is given by:

$$X[z] = \frac{A[z] + M * V[z]}{B[z]}$$

where B[z] represents the discrete-time channel in which the data sequence is transmitted over and V[z] is the z-transform of an integer sequence.

In one embodiment, B[z] is estimated during startup at the receiving entity. This can be done by adaptively adjusting a DFE, for example by using a known training sequence, and then passing the feedback part of the DFE, which gives the desired impulse response of the channel, back to the transmitter. In another embodiment, if the channel is not completely known at the transmitter, any residual ISI or mismatch due to estimation errors can be subsequently removed by adaptive equalization at the receiver. In general, employing pre-coder 250 can help to avoid many of the disadvantages associated with decision feedback equalizers (DFEs), including error propagation.

Figure 6:
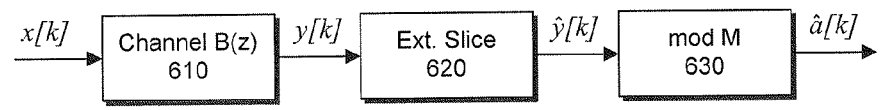
FIG. 6 illustrates the efficacy of the precoder encoder in equalizing a transmission channel, according to embodiments of the present invention.

The efficacy of pre-coder 250 can be seen in FIG. 6, which illustrates an example flow 600 of the pre-coded symbol sequence {x[k]} through the channel B(z) 610, which introduces ISI and other noise, yielding the symbol sequence {y[k]} at the receiver. At the receiver, an inverse pre-coder estimates the original data sequence, producing recovered data signal {â[k]} that is ideally the same as the original symbol sequence {a[k]}. In FIG. 6, the inverse pre-coder at the receiver specifically implements an extended slicer 620 and a mod M module 630. Extended slicer 620 is configured to quantize the received samples of symbol sequence {y[k]} to produce quantized data symbol sequence {ŷ[k]}. The term extended is used to denote that fact that extended slicer 620 does not only operate inside the original PAM-M constellation set, but also over all replicas of the original constellation that may occur after ISI has been introduced by the channel B(z).

It should be noted that, in at least one embodiment of pre-coder 250, the discrete channel B(z) is always monic and minimum phase and includes only integer coefficients.

Referring back to FIG. 2, after undergoing pre-coding, the pre-coded data stream is finally processed by TX filter 260. In general, high speed signals transmitted over traces on a PCB tend to suffer from high-frequency attenuation that makes reliable detection of the transmitted data at the receiver more difficult. The overall effect is similar to a low pass filter which decreases high-frequency signal gain. Dielectric loss, skin effect, and crosstalk are generally the main culprits.

In one embodiment, TX filter 260 is configured to boost the high frequency components of the data signal, while not affecting the low frequency components. In another embodiment, TX filter 260 is configured to suppress the low frequency components, while not affecting the high frequency components.

Figure 7:
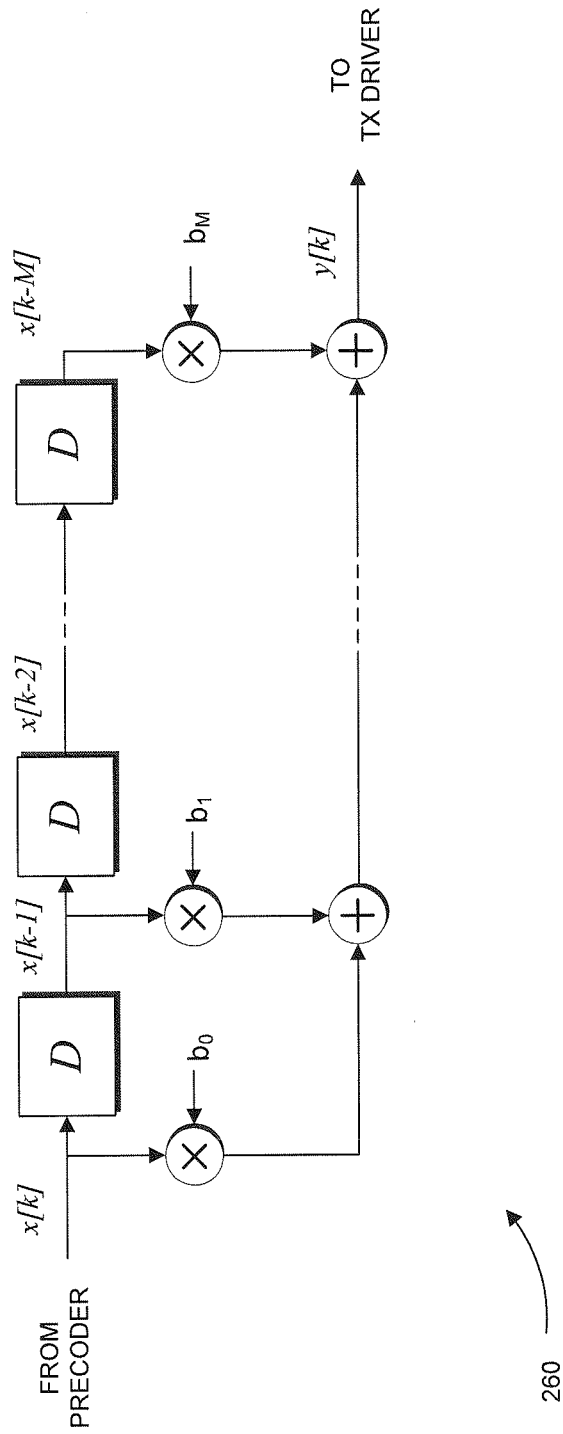
FIG. 7 illustrates an exemplary pre-emphasis or TX linear filter, according to embodiments of the present invention.

FIG. 7 illustrates an example implementation of TX filter 260, according to embodiments of the present invention. As illustrated in FIG. 7, TX filter 260 is implemented as a finite impulse response (FIR) filter and can include one or more delay elements 'D' and taps. In one embodiment, the tap values $b_0, b_1, \ldots, b_m$, can be dynamically adjusted during operation to provide different pre-emphasis levels depending on channel conditions.

After undergoing filtering by TX filter 260, the modulated data stream is subsequently placed on the physical channel at output 280 and is transmitted to a receiving entity. Prior to being placed on the physical channel, however, TX filter 260 can level shift the modulated data stream such that the average DC transmitted is zero. An example receiving entity will now be described further below in regard to FIG. 3. Before discussing the receiving entity, it should be noted that one or more of the processing blocks in transmitter 200 can be omitted and/or replaced by reasonable variants as would be appreciated by a person of ordinary skill in the art without departing from the scope and spirit of the present invention.

3. RECEIVER

Figure 3:
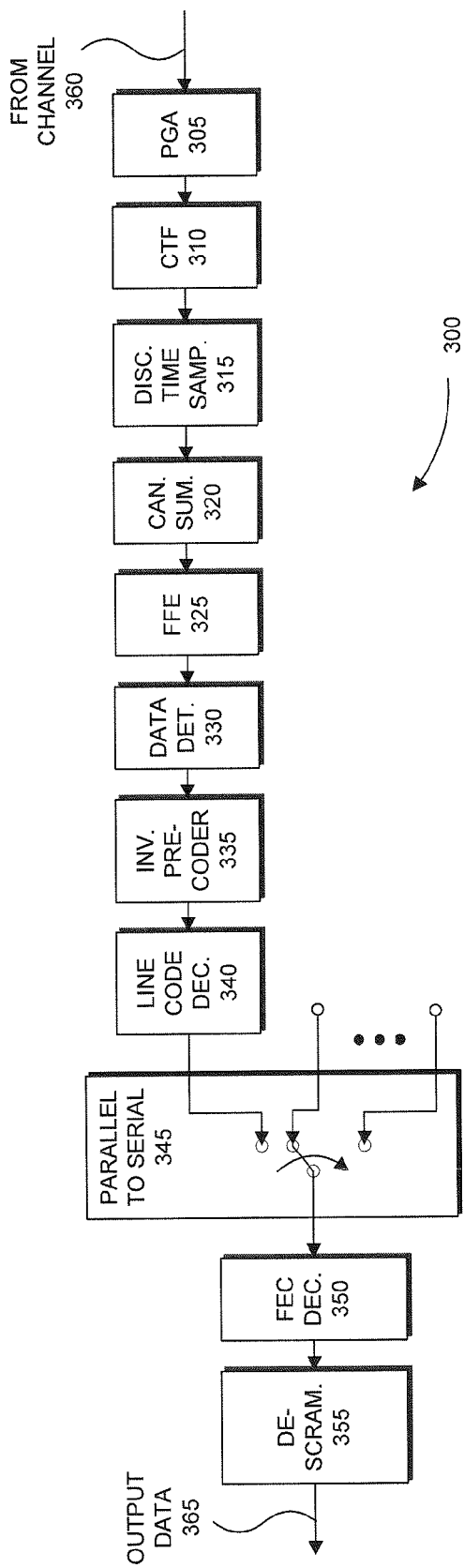
FIG. 3 illustrates an exemplary receiver, according to embodiments of the present invention.

FIG. 3 illustrates an example receiver 300, according to embodiments of the present invention. As illustrated in FIG. 3, receiver 300 includes a programmable gain amplifier (PGA) 305, a continuous time filter (CTF) 310, a discrete time sampler 315, a cancellation summer 320, a feed forward equalizer (FFE) 325, a data detector 330, an inverse pre-coder 335, a line code decoder 340, a parallel-to-serial module 345, a FEC decoder 350, and a de-scrambler 355.

In one embodiment, receiver 300 is implemented within a line card transceiver and is configured to receive data over one or more traces on a printed circuit board in a Backplane Ethernet system, such as Backplane Ethernet system 100. More particularly, receiver 300 is configured to receive data modulated in accordance with a PAM scheme having an order greater than the typically employed PAM-2 scheme in conventional Backplane Ethernet systems. For example, and in one embodiment, receiver 300 is configured to receive data that has been modulated in accordance with PAM-4 and received at a baud rate at or above the conventional 10.3125 GHz rate. However, it should be noted that receiver 300 can be configured to receive data that has been modulated in accordance with any reasonable modulation order and scheme.

In operation, receiver 300 receives at input 360 a modulated data stream from a physical channel. Receiver 300 is configured to manipulate the modulated data stream to properly recover an output data stream and provide the output data stream at output 365. The output data stream can include voice, video, or any other application or program specific data.

In order to recover the output data stream, the modulated data stream received at input 360 is first processed by PGA 305. PGA 305 is configured to amplify the modulated data stream, while at the same time adding minimal noise to the modulated data stream. Because the transmission channel from which the data stream is received can vary greatly in terms of the attenuation it provides to the modulated data stream during transmission, PGA 305 is made programmable such that receiver 300 can adjust to different channel conditions such as length, for example.

After being amplified by PGA 305, the modulated data stream is received and processed by CTF 310. In one embodiment, CTF 310 is configured to suppress excess thermal noise and other high frequency noise sources (e.g., any electromagnetic emissions) in the modulated data stream. In another embodiment, CTF 310 is further configured to boost mid to high frequency components of the modulated data stream.

The modulated data stream after being filtered by CTF 310 is received and processed by discrete time sampler 315. In general, discrete time sampler is configured to sample the modulated data stream in time and provide discrete samples at its output. In one embodiment, discrete time sampler 315 is an analog-to-digital converter (ADC) that not only samples in time, but also quantizes in amplitude the modulated data stream.

After being sampled, the samples of the modulated data stream are then received and processed by cancellation summer 320. In one embodiment, cancellation summer 320 is configured to cancel, from the samples of the modulated data stream, one or more sources of noise or distortion that can be modeled. For example, cancellation summer 320 can be configured to inject a canceling signal that models near end cross talk (NEXT) noise and/or distortions produced by PGA 305, CTF 310, and/or sampler 315. In one embodiment, cancellation summer 320 is configured to model and cancel only the third-harmonic component of a noise source or distortion, which is often the most dominant component. In other embodiments, cancellation summer 320 is configured to model and cancel other harmonic components of a noise source or distortion, in addition to the third-harmonic component.

Following cancellation summer 320 is FFE 325. FFE 325, in one embodiment, is implemented as a parallel FFE and is configured to reduce the negative influence of precursor ISI on a data symbol received over the physical channel. Specifically, FFE 325 is configured to delay a data symbol by one or more symbol periods so that an appropriately weighted combination of future symbols that interfere with the current symbol can be used to compensate for precursor ISI. In another embodiment, FFE 325 is configured to reduce precursor and/or postcusor ISI on a data symbol received over the physical channel. In yet another embodiment, FFE 325 is configured to put the ISI and noise into a relationship optimal for a data detector and/or a decision feedback equalizer (DFE).

In general, in a non-parallel FFE implementation, a series of delay elements and taps are used to compensate for the precursor contribution of one or more future symbols on a current symbol. The future symbols are stored in and tapped from the series of delay elements. The tapped values are then multiplied by respective tap weights that are related to the extent of precursor ISI contributed by the future symbols. The resulting products are then subtracted from the current symbol being processed to substantially eliminate precursor ISI. In an embodiment, the tap weights are determined by an adaptation engine (not shown) and can be continually adapted by the adaptation engine to change with the conditions of the channel over which the data is received.

It should be noted that FFE 325 is optionally included in receiver 300. For example, in other embodiments, FFE 325 can be omitted and its function can be performed by a combination of other linear filters (e.g., TX linear filter 260 and CTF 310).

The next two processing blocks following FFE 325 are data detector 330 and inverse pre-coder 335. The implementation of one of these blocks generally effects the implementation of the other. Therefore, these two blocks are described below in combination for several different embodiments.

Figure 8:
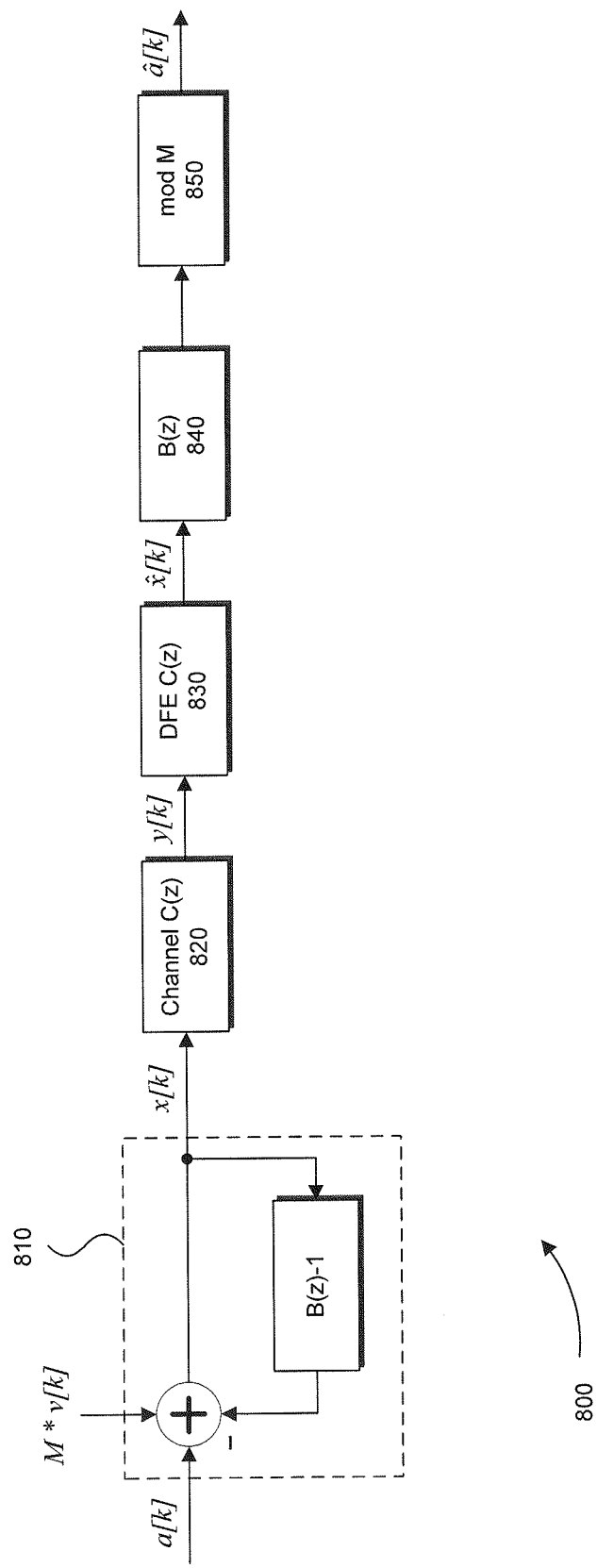
FIG. 8 illustrates an exemplary DFE and inverse precoder combination, according to embodiments of the present invention.

FIG. 8 specifically illustrates a first embodiment of this combination, referred to as a "DFE with an inverse pre-coder" 800. For explanation purposes, an exemplary pre-coder 810 and net channel C(z) 820 have been further illustrated in the "DFE with an inverse pre-coder" 800. However, it should be noted that pre-coder 810 and channel C(z) 820 are not actually included within the "DFE with an inverse pre-coder" 800. Rather, pre-coder 810 is implemented within the transmitting entity and the channel C(z) 820 represents the net of the physical channel over which data is transmitted to receiver 300 and can further include other linear filters in the transmitter 200 and receiver 300.

In this first embodiment of the combination of data detector 330 and inverse pre-coder 335, the data detector 330 is implemented as DFE 830, and the inverse pre-coder 335 is implemented as the combination of a finite impulse response (FIR) filter B(z) 840 and a mod M module 850. In this embodiment, DFE 830 knows nothing of pre-coder 810 at the transmitter. As a result, the polynomial B(z), used to implement the filter in the feedback loop of pre-coder 810, does not have to exactly match the polynomial C(z) that describes the discrete-time channel C(z) 820. DFE 830 simply estimates the pre-coded signal $\{x[k]\}$.

Figure 9:
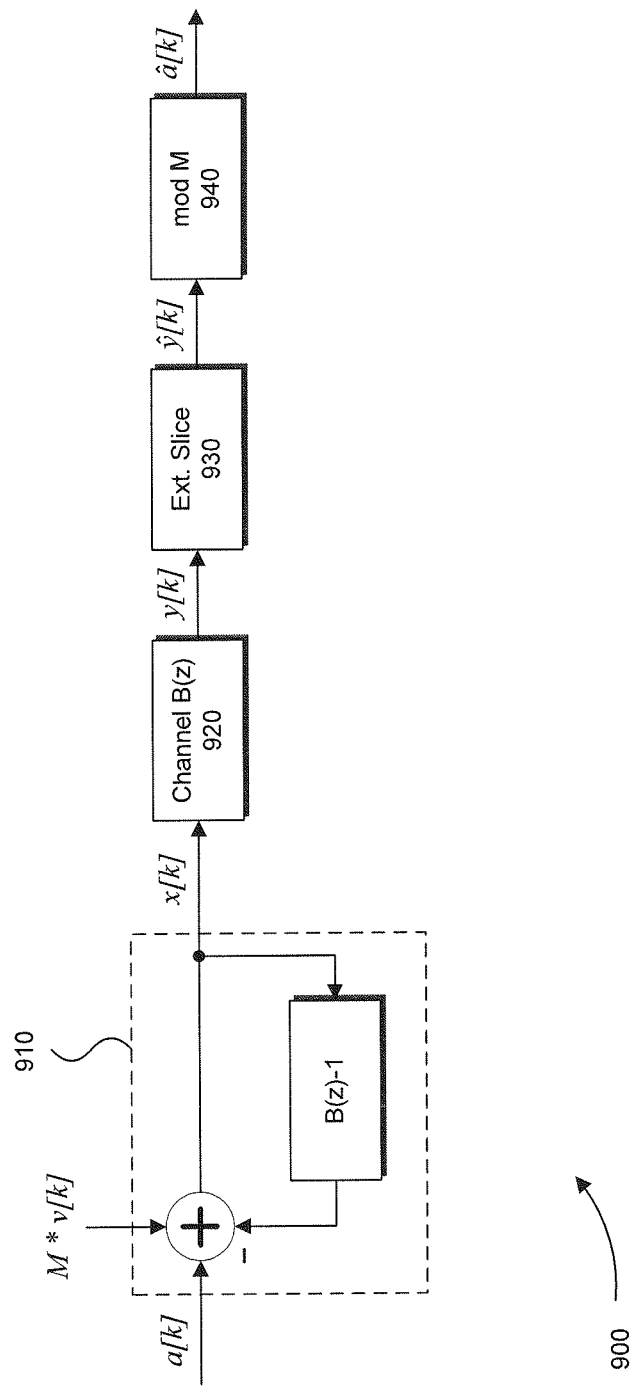
FIG. 9 illustrates an exemplary inverse precoder with an extended slicer, according to embodiments of the present invention.

FIG. 9 illustrates a second embodiment of the combination of data detector 330 and inverse pre-coder 335, referred to as an "inverse pre-coder with an extended slicer" 900. For explanation purposes, an exemplary pre-coder 910 and channel B(z) 920 have been further illustrated in the "inverse pre-coder with an extended slicer" 900. However, it should be noted that pre-coder 910 and channel B(z) 920 are not actually included within the "inverse pre-coder with an extended slicer" 900. Rather, pre-coder 910 is implemented within the transmitting entity and the net of the channel B(z) 920 represents the physical channel over which data is transmitted to receiver 300 and can further include other linear filters in the transmitter 200 and receiver 300.

In this second embodiment of the combination of data detector 330 and inverse pre-coder 335, the data detector 330 is implemented as extended slicer 930, and the inverse pre-coder 335 is implemented as a mod M module 940. In this embodiment, the DFE is completely eliminated and replaced by extended slicer 930. In one embodiment, because there is no feedback in extended slicer 930, the device can be parallelized in a fairly straightforward manner for a high-speed implementation without incurring a large penalty in terms of additional hardware. In addition, because the DFE is removed in this second embodiment, the known issue of error propagation associated with the DFE is eliminated.

Figure 10:
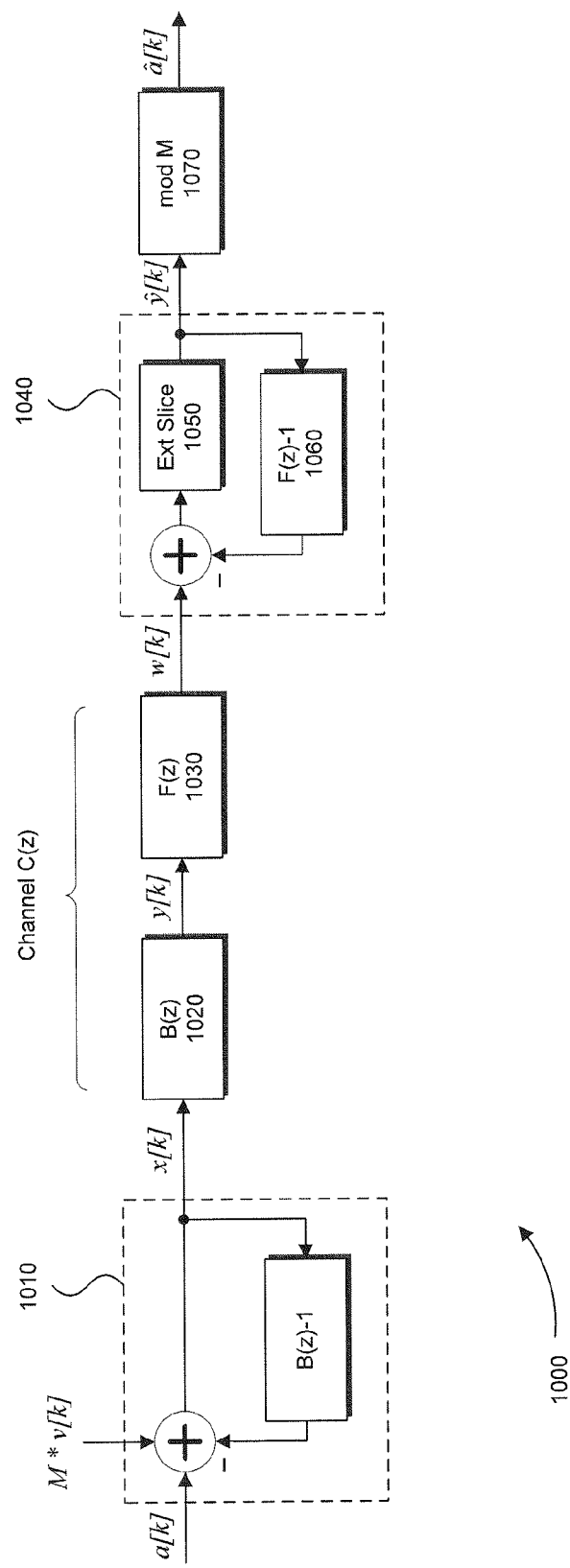
FIG. 10 illustrates an exemplary partial DFE and inverse precoder combination, according to embodiments of the present invention.

FIG. 10 illustrates a third embodiment of the combination of data detector 330 and inverse pre-coder 335, referred to as a "partial DFE with an inverse pre-coder" 1000. For explanation purposes, an exemplary pre-coder 1010 and channel represented by the combination of B(z) 1020 and F(z) 1030 have been further illustrated in the "inverse pre-coder with an extended slicer" 1000. However, it should be noted that pre-coder 1010 and the channel, represented by the cascaded combination of B(z) 1020 and F(z) 1030, are not actually included within the "inverse pre-coder with an extended slicer" 1000. Rather, pre-coder 1010 is implemented within the transmitting entity and the cascaded combination of B(z) 1020 and F(z) 1030 represents the physical channel over which data is transmitted to receiver 300, illustrated in FIG. 3.

In this third embodiment of the combination of data detector 330 and inverse pre-coder 335, the data detector 330 is implemented as DFE 1040, and the inverse pre-coder 335 is implemented as a mod M module 1070. As illustrated in FIG. 10, DFE 1040 includes an extended slicer 1050 and a filter [F(z)−1] 1060 implemented in its feedback loop. DFE 1040 is configured to perform equalization of the portion F(z) of the channel not taken care of by pre-coder 1010. However, extended slicer 1040 still needs to be extended to the same amount that pre-coder 1010 extends the pre-coded and filtered data signal $\{y[k]\}$. This third embodiment can be used advantageously, for example, when the L1 norm of F(z) is small because the error propagation from the DFE in this instance will be very small.

Referring back to FIG. 3, after being processed by data detector 330 and inverse pre-coder 335, the inverse pre-coded data signal is received and processed by line code decoder 340. In general, line code decoder 340 is configured to demodulate the symbols of the inverse pre-coded data signal.

For example, assuming the symbols represent PAM-4 data, line code decoder 340 is configured to demodulate each symbol into its corresponding two-bit value.

The demodulated bit-stream is subsequently passed to parallel-to-serial module 345 that is configured to serialize two or more demodulated bit streams into a single serial data stream. In general, parallel-to-serial module 345 is optionally included within receiver 300 when receiver 300 receives data over two or more traces. For clarity sake, only one set of serial processing blocks is shown coupled to an input of parallel-to-serial module 345. However, it should be noted that additional sets of serial processing blocks can be used in receiver 300 depending on the number of parallel data streams it is configured to receive.

The serialized data stream produced by parallel-to-serial module 345 is subsequently received and processed by FEC decoder 350. In general, FEC decoder 350 is configured to detect and recover transmission errors in the serialized data stream and can be configured to operate in accordance with any one of a number of different FEC schemes, including, for example, Trellis Coded Modulation (TCM), Low Density Parity Check (LDPC) codes, and BCH codes such as Reed-Solomon (RS). In one embodiment, FEC decoder 350 is configured to use one or more redundant symbols, conveying error detection and correction information, to correct and/or detect errors in a block of data received by receiver 300 over two or more parallel data streams.

In another embodiment, FEC decoder 350 is positioned before parallel-to-serial module 345 in the receiver chain. In this instance, a separate FEC decoder 350 is used for each parallel data stream received by parallel-to-serial module 345.

Finally, after being processed by FEC decoder 350, the error corrected serial data stream is received and processed by de-scrambler 355, which performs the inverse of any scrambling function performed at the transmitting entity to remove long sequences of digital '0' or '1' values. The de-scrambled data is provided as the recovered output data stream at output 365.

4. TRAINING

Figure 11:
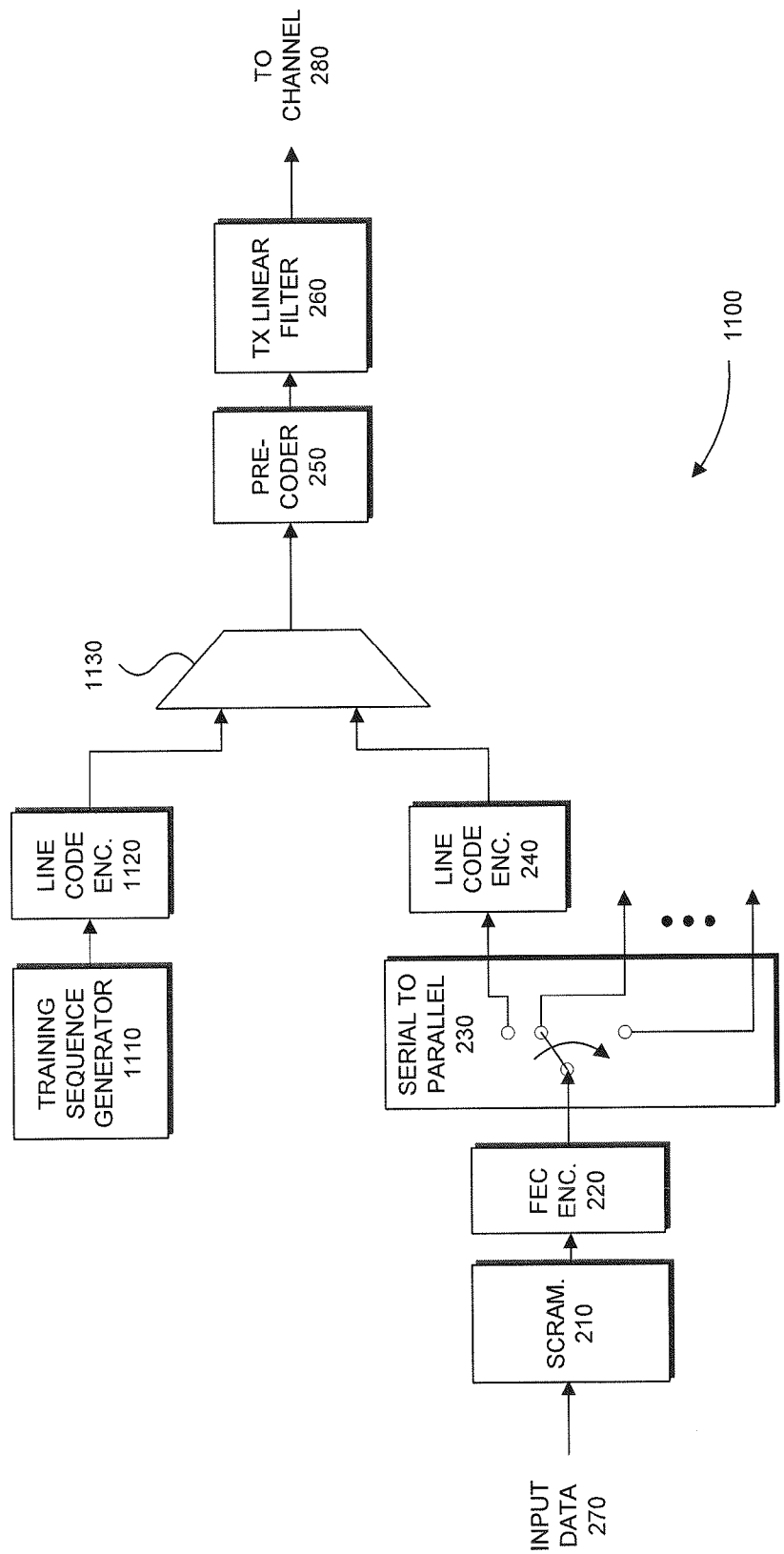
FIG. 11 illustrates an exemplary transmitter configured to generate and send a training sequence to a receiver during select times, according to embodiments of the present invention.

FIG. 11 illustrates an example receiver 1100 that includes a training sequence path, according to embodiments of the present invention. More specifically, receiver 1100 includes substantially the same structure as transmitter 200, illustrated in FIG. 2. However, an additional training sequence generator 1110, line code encoder 1120, and multiplexer 1130 have been added. In generally, training sequence generator 1110 is configured to generate a bit sequence known to a receiving entity, such as receiver 300 illustrated in FIG. 3, such that the different processing block within the receiver and transmitter can be adjusted.

For example, and in one embodiment, the impulse response of the physical channel between the transmitter and receiver can be estimated using the training sequence at the receiver. This channel estimate can be used to setup a FFE or DFE at a receiver, or a pre-coder at the transmitter, such as pre-coder 250 illustrated in FIG. 2. In one embodiment, the pre-coder can be adjusted by adaptively adjusting a DFE implemented at the receiver using the known training sequence, and then passing the feedback part of the DFE, which gives the desired impulse response of the channel, back to the transmitter.

In another embodiment, the gain setting of a PGA, such as PGA 305 in receiver 300, can be determined using the known training sequence. In yet another embodiment, a continuous time filter (CTF), such as CTF 310 in receiver 300, can be adjusted based on the known training sequence. In yet another embodiment the training sequence can be used at a receiver, such as receiver 300, to estimate distortions produced by blocks within the receiver that process a received signal. For example, distortions produced by PGA 305 and sampler 315 in receiver 300 can be estimated using the known training sequence such that the distortions can be removed from a received signal by cancellation summer 320.

The above embodiments provide just a few examples of the processing blocks that can be adjusted at a receiver and transmitter in communication. A person of ordinary skill in the art would recognize that other adjustments of processing blocks, such as the processing blocks in transmitter 200 illustrated in FIG. 2 and receiver 300 illustrated in FIG. 3 are possible.

Referring back to FIG. 11, line code encoder 1120 can be optionally included to allow the bits of the training sequence generated by training sequence generator 1110 to be modulated in accordance with a different modulation scheme other than the modulation scheme implemented by line code encoder 240. For example, and in one embodiment, line code encoder 240 can be configured to modulate the data bits it receives in accordance with PAM-4, whereas line code encoder 1120 can be configured to modulate the bits of the training sequence in accordance with PAM-2. In an embodiment, using a lower order modulation scheme can better allow the processing blocks of the transmitter and receiver to be adjusted based on the training sequence.

Multiplexer 1130 is used to select between the modulated training sequence and the actual modulated data stream. In one embodiment, the modulated training sequence is selected during initialization of the communication channel between the transmitter and receiver. In another embodiment, the training sequence is selected periodically after the communication line has been setup between the transmitter and receiver to adjust processing blocks based on changing channel conditions.

5. AUTO NEGOTIATION

In an embodiment, an auto-negotiation process can be further used to enable two Backplane Ethernet transceivers to automatically communicate their respective capabilities and take advantage of their maximum common capability. For example, two Backplane Ethernet transceivers can auto-negotiate a particular FEC scheme to use during communication with each other. In one embodiment, at least one of the Backplane Ethernet transceivers can include a transmitter configured in accordance with transmitter 200, illustrated in FIG. 2, and a receiver configured in accordance with receiver 300, illustrated in FIG. 3.

In an embodiment, the selection of one FEC scheme over another during auto-negotiation is determined based on the SNR supported by the physical links coupling the two Backplane Ethernet transceivers and/or the noise conditions in general. If the physical links support a low SNR due to, for example, noisy PCB traces or a noisy Backplane, a more powerful FEC scheme can be selected. On the other hand, if the physical links support a high SNR, a less powerful FEC scheme can be selected to improve latency. In general, the power of a FEC scheme increases with the number of redundancy bits or symbols transmitted for a given number of data bits or symbols.

In another embodiment, the selection of one FEC scheme over another during auto-negotiation is determined based on a desired latency. To provide less latency, a less powerful FEC scheme can be selected during auto-negotiation. In general, latency increases with the power of the FEC scheme.

Another area in which auto-negotiation can be used, and the SNR of a Backplane Ethernet communication system can be improved to enable faster data rates, is in the area of cross-talk between a transceiver's transmitter and receiver. In general, a Backplane Ethernet transceiver's transmission signal is much more powerful than the weak signals it typically receives. Because transmission lines that are respectively coupled to a Backplane Ethernet transceiver's transmitter and receiver are general close to each other on a printed circuit board, they are susceptible to cross-talk interference. In particular, the receiver of a Backplane Ethernet transceiver can become saturated with near end cross-talk noise from its own transmitter.

One approach to combat near end cross-talk (NEXT) noise and improve SNR is to cancel these signals out. Cancellation of these signals can be performed at receiver 300, for example, by cancellation summer 320 described above. However, cancellation of these signals is generally performed more efficiently if the transmitter and receiver are sending and receiving data respectively using a common clock. In conventional Backplane Ethernet systems, two transceivers in communication transmit data according to their own respectively derived clocks. In an embodiment, during the initial period of communication between the two Backplane Ethernet transceivers, through an auto negotiation process, a Master-Slave relationship can be established. Specifically, the two Backplane Ethernet transceivers in communication can negotiate and then agree on their respective status as Master and Slave. The Backplane Ethernet transceiver established as the Master can provide the clock in which each transmitter of the two respective backplane Ethernet transceivers can transmit data according to. In other words, the Slave Backplane Ethernet transceiver locks on to the transmitter clock of the Master Backplane Ethernet transceiver and transmits data according to that clock. As noted above, using a common clock for the transmission of data increases the effectiveness of cancellation in removing cross-talk noise generated between a transmitter and receiver.

In one embodiment, each parallel stream transmitted by the Backplane Ethernet is transmitted in accordance with the same Master clock and each phy associated with the streams are designated as being all Masters or all Slaves. In another embodiment, each parallel stream, within a designated group of parallel streams that are aggregated to form one stream (e.g., four 25 Gbps streams aggregated to produce one 100 Gbps stream), are transmitted by the Backplane Ethernet in accordance with the same Master clock and each phy associated with the streams are designated as being all Masters or all Slaves.

6. CONCLUSION

It is to be appreciated that the Detailed Description section, and not the Abstract section, is intended to be used to interpret the claims. The Abstract section may set forth one or more but not all exemplary embodiments of the present invention as contemplated by the inventor(s), and thus, is not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A transmitter configured to manipulate an input data stream to properly format an output data stream for transmission over a channel disposed on a backplane, the transmitter comprising:
    a scrambler configured to remove sequences of digital zero or digital one values from the input data stream to provide a scrambled data stream;
    a forward error correction (FEC) encoder configured to generate and append redundant symbols to the scrambled data stream to provide a FEC encoded data stream, wherein the redundant symbols allow a receiver to detect and correct for errors that occur during transmission of the FEC encoded data stream;
    a line code encoder configured to modulate the FEC encoded data stream using a pulse amplitude modulation (PAM) scheme having an order M greater than two to provide a modulated data stream;
    a pre-coder configured to perform channel pre-equalization and power limiting on the modulated data stream to provide a pre-coded data stream, wherein the pre coder comprises an infinite impulse response (IIR) filter to perform channel pre-equalization and a modulo M device to perform transmit power limiting; and
    a TX linear filter configured to adjust the pre-coded data stream to compensate for high-frequency attenuation of the channel to provide the output data stream.

2. The transmitter of claim 1, wherein the IIR filter is configured to have a transfer function substantially equal to an inverse transfer function of the channel.

3. The transmitter of claim 1, wherein the modulo M device is configured to limit symbols of the pre-coded data stream to have an amplitude within the interval $[0, 1, \ldots, M-1]$.

4. The transmitter of claim 1, wherein the FEC encoder is configured to generate the redundant symbols in accordance with a Reed Solomon encoding technique.

5. The transmitter of claim 1, further comprising a training sequence generator configured to generate a sequence of training bits known to a receiving entity.

6. The transmitter of claim 5, further comprising a second line code encoder configured to modulate the sequence of training bits.

7. The transmitter of claim 6, further comprising a multiplexer configured to provide as output either the modulated sequence of training bits or the modulated data stream based on a select signal.

8. The transmitter of claim 1, wherein the transmitter is further configured to perform an auto-negotiation process with a receiving entity to determine a FEC scheme to be used by the FEC encoder based on a signal-to-noise ratio (SNR) supported by the channel or a desired latency.

9. The transmitter of claim 1, wherein the transmitter is further configured to perform an auto-negotiation process with a receiving entity to establish a master-slave relationship such that the transmitter and the receiving entity communicate with each other based on a common clock.

10. A receiver configured to manipulate a modulated data stream received over a channel disposed on a backplane to properly recover an output data stream, the receiver comprising:
  a discrete time sampler configured to sample the modulated data stream in time to provide a sampled modulated data stream;
  a decision feedback equalizer (DFE) with an inverse pre-coder configured to detect symbols within the sampled modulated data stream and perform a modulo M operation on the detected symbols to provide an inverse pre-coded symbol stream;
  a line code decoder configured to demodulate the inverse pre-coded symbol stream to provide a demodulated data stream, wherein the inverse pre-coded symbol stream has been modulated in accordance with a pulse amplitude modulation (PAM) scheme having an order greater than two;
  a forward error correction (FEC) decoder configured to detect and correct for errors in the demodulated data stream to provide an error corrected data stream; and
  a de-scrambler configured to perform an inverse scrambling function on the error corrected data stream to provide the output data stream.

11. The receiver of claim 10, further comprising a feed forward equalizer (FFE) configured to reduce pre-cursor intersymbol interference (ISI) on the sampled modulated data stream prior to the sampled modulated data stream being processed by the DFE with the inverse pre-coder.

12. The receiver of claim 10, further comprising a cancellation summer configured to substantially cancel from the sampled modulated data stream near end cross talk (NEXT) noise prior to the sampled modulated data stream being processed by the DFE with the inverse pre-coder.

13. A receiver configured to manipulate a modulated data stream received over a channel disposed on a backplane to properly recover an output data stream, the receiver comprising:
  a discrete time sampler configured to sample the modulated data stream in time to provide a sampled modulated data stream;
  an inverse pre-coder with an extended slicer configured to detect symbols within the sampled modulated data stream and perform a modulo M operation on the detected symbols to provide an inverse pre-coded symbol stream;
  a line code decoder configured to demodulate the inverse pre-coded symbol stream to provide a demodulated data stream, wherein the inverse pre-coded symbol stream has been modulated in accordance with a pulse amplitude modulation (PAM) scheme having an order greater than two;
  a forward error correction (FEC) decoder configured to detect and correct for errors in the demodulated bit stream to provide an error corrected data stream; and
  a de-scrambler configured to perform an inverse scrambling function on the error corrected data stream to provide the output data stream.

14. The receiver of claim 13, further comprising a feed forward equalizer (FFE) configured to reduce pre-cursor intersymbol interference (ISI) on the sampled modulated data stream prior to the sampled modulated data stream being processed by the inverse pre-coder with the extended slicer.

15. The receiver of claim 13, further comprising a cancellation summer configured to substantially cancel from the sampled modulated data stream near end cross talk (NEXT) noise prior to the sampled modulated data stream being processed by the inverse pre-coder with the extended slicer.

16. A receiver configured to manipulate a modulated data stream received over a channel disposed on a backplane to properly recover an output data stream, the receiver comprising:
  a discrete time sampler configured to sample the modulated data stream in time to provide a sampled modulated data stream;
  a partial decision feedback equalizer (DFE) with an inverse pre-coder configured to detect symbols within the sampled modulated data stream and perform a modulo M operation on the detected symbols to provide an inverse pre-coded symbol stream;
  a line code decoder configured to demodulate the inverse pre-coded symbol stream to provide a demodulated data stream, wherein the inverse pre-coded symbol stream has been modulated in accordance with a pulse amplitude modulation (PAM) scheme having an order greater than two;
  a forward error correction (FEC) decoder configured to detect and correct for errors in the demodulated bit stream to provide an error corrected data stream; and
  a de-scrambler configured to perform an inverse scrambling function on the error corrected data stream to provide the output data stream.

17. The receiver of claim 16, further comprising a feed forward equalizer (FFE) configured to reduce pre-cursor intersymbol interference (ISI) on the sampled modulated data stream prior to the sampled modulated data stream being processed by the partial DFE with the inverse pre-coder.

18. The receiver of claim 16, further comprising a cancellation summer configured to substantially cancel from the sampled modulated data stream near end cross talk (NEXT) noise prior to the sampled modulated data stream being processed by the partial DFE with the inverse pre-coder.

* * * * *